(12) United States Patent
Jung et al.

(10) Patent No.: US 10,741,396 B2
(45) Date of Patent: Aug. 11, 2020

(54) SUBSTRATE PROCESSING APPARATUS

(71) Applicant: EUGENE TECHNOLOGY CO., LTD., Yongin-Si, Gyeonggi-Do (KR)

(72) Inventors: Woo Duck Jung, Suwon-Si (KR); Sung Tae Je, Yongin-Si (KR); Kyu Jin Choi, Yongin-Si (KR); Seong Min Han, Yongin-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 188 days.

(21) Appl. No.: 15/566,694

(22) PCT Filed: Apr. 12, 2016

(86) PCT No.: PCT/KR2016/003861
§ 371 (c)(1),
(2) Date: Oct. 13, 2017

(87) PCT Pub. No.: WO2016/167554
PCT Pub. Date: Oct. 20, 2016

(65) Prior Publication Data
US 2018/0090323 A1 Mar. 29, 2018

(30) Foreign Application Priority Data
Apr. 14, 2015 (KR) .......................... 10-2015-0052533

(51) Int. Cl.
H01L 21/60 (2006.01)
H01L 21/205 (2006.01)
(Continued)

(52) U.S. Cl.
CPC .......... *H01L 21/2053* (2013.01); *H01L 21/02* (2013.01); *H01L 21/02532* (2013.01);
(Continued)

(58) Field of Classification Search
CPC ........... H01L 21/2053; H01L 21/67303; H01L 21/67109; H01L 21/02532; H01L 21/683; H01L 21/02; H01L 21/205
(Continued)

(56) References Cited

U.S. PATENT DOCUMENTS 5,217,560 A * 6/1993 Kurono ............... H01J 37/3244
118/723 R
7,900,580 B2 * 3/2011 Kontani ................ C23C 16/452
118/723 E
(Continued)

FOREIGN PATENT DOCUMENTS

| CN | 103959438 A | 7/2014 |
| JP | H06326038 A | 11/1994 |

(Continued)

OTHER PUBLICATIONS

International Search Report for PCT/KR2016/003861 dated Jul. 19, 2016.
(Continued)

*Primary Examiner* — Rudy Zervigon
(74) *Attorney, Agent, or Firm* — Renaissance IP Law Group LLP

(57) ABSTRACT

Provided is a substrate processing apparatus. The substrate processing apparatus includes a tube having an inner space, a substrate support on which a plurality of substrates are stacked in multistage within the tube, the substrate support individually defining a plurality of processing spaces in which the plurality of substrates are respectively processed, a first gas supply part configured to supply a first gas into all the plurality of processing spaces, a second gas supply part comprising a plurality of injectors disposed to respectively correspond to the plurality of processing spaces so that the second gas is individually supplied onto each of the plurality of substrates, and an exhaust part configured to exhaust the
(Continued)

gases within the tube. Thus, the gas may be individually supplied into each of the processing spaces in which the plurality of substrates are respectively processed.

9 Claims, 6 Drawing Sheets

(51) Int. Cl.
H01L 21/02 (2006.01)
H01L 21/67 (2006.01)
H01L 21/673 (2006.01)
H01L 21/683 (2006.01)

(52) U.S. Cl.
CPC ...... *H01L 21/205* (2013.01); *H01L 21/67109* (2013.01); *H01L 21/67303* (2013.01); *H01L 21/683* (2013.01)

(58) Field of Classification Search
USPC .............. 118/715, 728; 156/345.29, 345.33, 156/345.34
See application file for complete search history.

(56) References Cited

U.S. PATENT DOCUMENTS

| | | | |
|---|---|---|---|
| 8,394,200 B2* | 3/2013 | Matsuura | C23C 16/452 118/715 |
| 2008/0121180 A1 | 5/2008 | Kontani et al. | |
| 2010/0275848 A1* | 11/2010 | Fukuda | C23C 16/325 118/728 |
| 2012/0000425 A1* | 1/2012 | Park | C23C 16/45565 118/724 |
| 2014/0357058 A1 | 12/2014 | Takagi et al. | |

FOREIGN PATENT DOCUMENTS

| | | |
|---|---|---|
| JP | H0745529 A | 2/1995 |
| JP | 2003045864 A | 2/2003 |
| JP | 2011142347 A | 7/2011 |
| JP | 2014116484 A | 6/2014 |
| JP | 2015503227 A | 1/2015 |
| KR | 20030013303 A | 2/2003 |
| KR | 20070096875 A | 10/2007 |
| KR | 101308111 B1 | 9/2013 |
| KR | 101364701 B1 | 2/2014 |
| KR | 101371435 B1 | 3/2014 |
| KR | 101392378 B1 | 5/2014 |
| TW | 200620427 A | 6/2006 |
| TW | 201131655 A | 9/2011 |
| TW | 201324590 A | 6/2013 |
| TW | 201511131 A | 3/2015 |
| TW | 201513219 A | 4/2015 |

OTHER PUBLICATIONS

International Preliminary Report on Patentability for PCT/KR2016/003861 dated Oct. 26, 2017 and the translation of the Written Opinion dated Jul. 19, 2016.

* cited by examiner

142 : 142a, 142b, 142c, 142d, 142e
152 : 152a, 152b, 152c, 152d, 152e, 152f, 152g

SUBSTRATE PROCESSING APPARATUS

TECHNICAL FIELD

The present disclosure relates to a substrate processing apparatus, and more particularly, to a substrate processing apparatus that is capable of individually supplying a gas into spaces in which a plurality of substrates are respectively processed.

BACKGROUND ART

In general, substrate processing equipment is classified into single wafer type substrate processing equipment capable of processing one substrate at a time and batch type substrate processing equipment capable of processing a plurality of substrates at the same time. The single wafer type substrate processing equipment has a simple structure, but has low productivity. Thus, the batch type substrate processing equipment capable of being mass-producing substrates is being widely used.

The batch type substrate processing equipment includes a processing chamber in which substrates horizontally stacked in multistage are accommodated and processed, a processing gas supply nozzle for supplying a processing gas into the processing chamber, and an exhaust line through which a gas in the processing chamber is exhausted. A substrate processing process using the batch type substrate processing equipment may be performed as follows. First, a plurality of substrate are loaded into the processing chamber. Then, while a gas within the processing chamber is exhausted through the exhaust line, a processing gas is supplied into the processing chamber through the processing gas supply nozzle. Here, the processing gas injected from the processing gas supply nozzle is introduced into the exhaust line while passing between the substrates to form a thin film on each of the substrates.

However, in the substrate processing equipment according to the related art, the processing gas may be supplied into the processing gas supply nozzle through one processing gas supply line. Thus, only the total amount of processing gas supplied into the processing chamber may be controlled, but an amount of processing gas supplied onto each of the substrates may not be separately controlled. That is, a concentration of the processing gas supplied onto each of the substrates may not be separately controlled. Thus, since the thin film is not controlled in thickness in consideration of the state of the substrate, the thin films of the plurality of substrates may be different from each other.

DISCLOSURE OF THE INVENTION

Technical Problem

The present disclosure provides a substrate processing apparatus that is capable of individually supplying a gas into processing spaces in which a plurality of substrate are respectively processed.

The present disclosure also provides a substrate processing apparatus that is capable of controlling selective supply of at least one kind of gas according to a situation of a substrate processing process.

The present disclosure also provides a substrate processing apparatus that is capable of improving efficiency of a substrate processing process.

Technical Solution

In accordance with an exemplary embodiment, a substrate processing apparatus includes: a tube having an inner space; a substrate support on which a plurality of substrates are stacked in multistage within the tube, the substrate support individually defining a plurality of processing spaces in which the plurality of substrates are respectively processed; a first gas supply part configured to supply a first gas into all the plurality of processing spaces; a second gas supply part including a plurality of injectors disposed to respectively correspond to the plurality of processing spaces so that the second gas is individually supplied onto each of the plurality of substrates; and an exhaust part configured to exhaust the gases within the tube.

The first gas supply part may include: an injection unit extending in a direction in which the substrates are stacked; and a gas supply unit connected to the injection unit to supply the gas into the injection unit, wherein a plurality of injection holes defined to correspond to the processing spaces in the direction in which the substrates are stacked may be defined in the injection unit.

The plurality of injection holes may have diameters that gradually increase in a direction that is away from the portion at which the injection unit and the gas supply unit are connected to each other.

The second gas supply part may include: a plurality of injectors having heights different from each other to respectively correspond to the processing spaces; and a plurality of gas supply lines respectively connected to ends of the injectors.

Injection holes through which the gas is injected may be defined in the other ends of the injectors, and the injection holes may be spirally defined along a circumference of the tube.

Each of the plurality of gas supply lines may include: a gas tube configured to define a path through which the gas moves, the gas tube being connected to each of the injectors; a flow sensor installed in the gas tube to measure a flow rate of the gas within the gas tube; and a valve installed in the gas tube to control the flow rate of the gas within the gas tube, wherein the plurality of gas supply lines may be individually controlled to individually measure the flow rate of the gas.

An injection hole defined in the first gas supply part and a through hole defined in the second gas supply part to correspond to the injection hole may be defined in a circumference of the tube.

The substrate processing apparatus may further include a rotational driving part connected to the substrate support to rotate the substrate support.

The substrate processing apparatus may further include an external tube configured to accommodate the tube therein, wherein an injection unit of the first gas supply part and the injectors of the second gas supply part may be disposed between the tube and the external tube.

The first gas supply part may supply the first gas including a silicon source gas.

The second gas supply part may selectively supply the second gas including at least one of a dopant gas and an etching gas onto each of the plurality of substrates.

The substrate support may include a plurality of isolation plates that are respectively disposed between the substrates in a stacking direction of the substrates to isolate the plurality of processing spaces from each other.

Advantageous Effects

In accordance with the exemplary embodiment, a gas supply part is capable of individually supplying the gas into a processing spaces in which the plurality of substrates are respectively processed. Thus, the amount of gas supplied into each of the processing spaces may be separately controlled according to a situation of each of the substrates. Thus, since the amount of supplied gas is controlled to be optimally supplied onto each of the substrates, the substrate or a thin film on the substrate may be improved in quality.

Also, in accordance with the exemplary embodiment, at least one kind of gas may be selectively supplied according to the situation of the processing process. Thus, a kind of gas to be supplied may be selected to adjust a thickness of the thin film formed on the substrate. Thus, the thin films on the plurality of substrates may have the uniform thickness on the whole to improve the quality of the thin film.

Also, since the amount and kind of gas supplied to each of the processing spaces are controlled, the conditions of the processing process may be quickly controlled according to the situation of the substrate. Thus, the defects of the substrate or the thin film on the substrate may be reduced to improve the efficiency of the substrate processing process.

Also, in accordance with the exemplary embodiment, the first gas supply part for supplying the main source gas and the second gas supply part for selectively supplying at least one of at least one kind of gas may be provided. Thus, when an amount of gas, which is selected in the second gas supply part, to be supplied into the processing space is controlled, a mixing ratio of the main source gas and the selected gas may be controlled. Also, the various substrate processing processes may be selectively performed according to the kind of gas selected in the second gas supply part.

MODE FOR CARRYING OUT THE INVENTION

Figure 1:
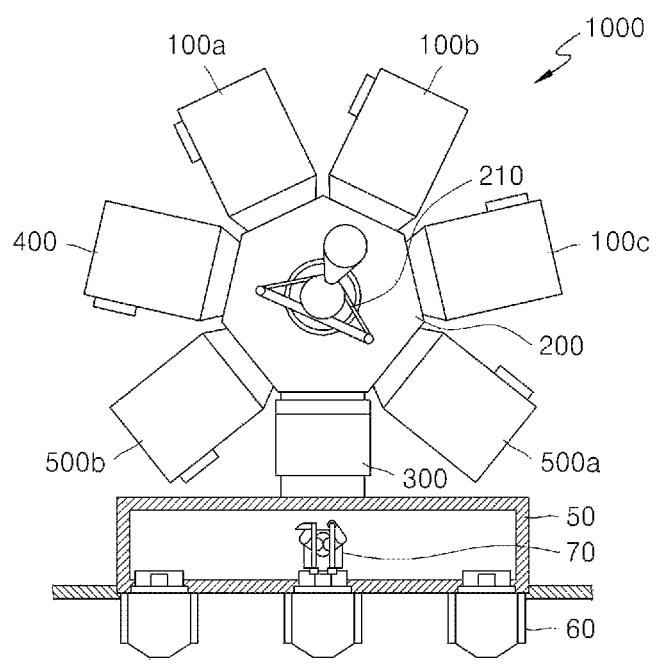
FIG. 1 is a schematic view of substrate processing equipment in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the figures, the dimensions of layers and regions are exaggerated for clarity of illustration. Like reference numerals refer to like elements throughout.

Figure 2:
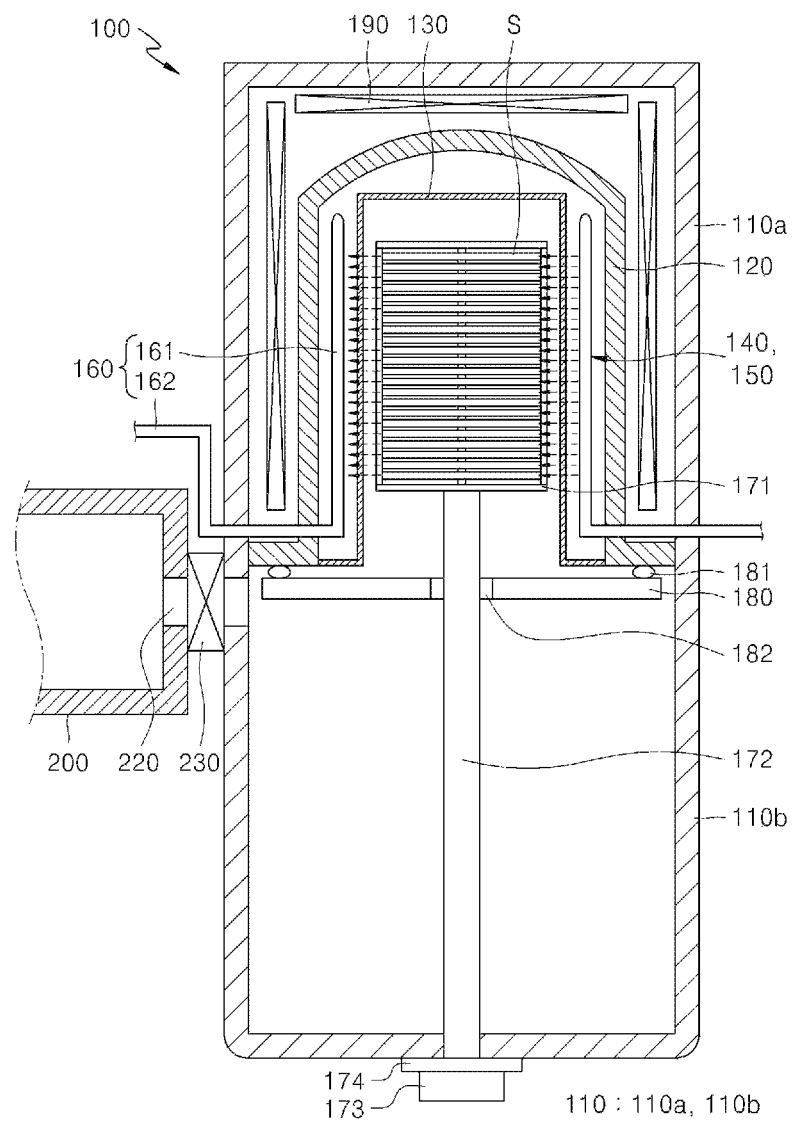
FIG. 2 is a view of a substrate processing apparatus in accordance with an exemplary embodiment.
Figure 3:
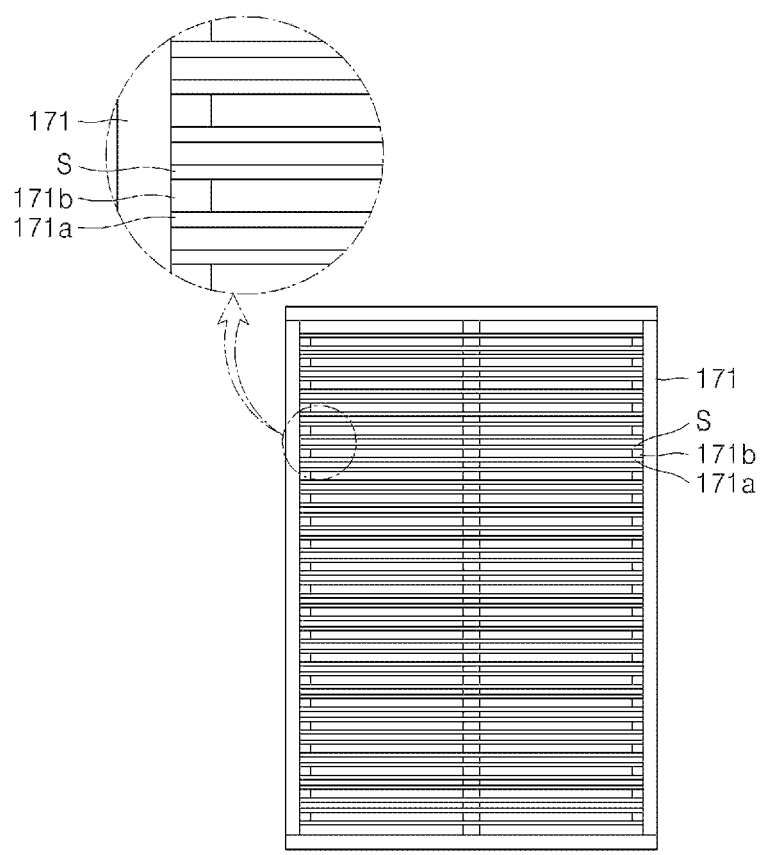
FIG. 3 is a view of a substrate support in accordance with an exemplary embodiment.
Figure 4:
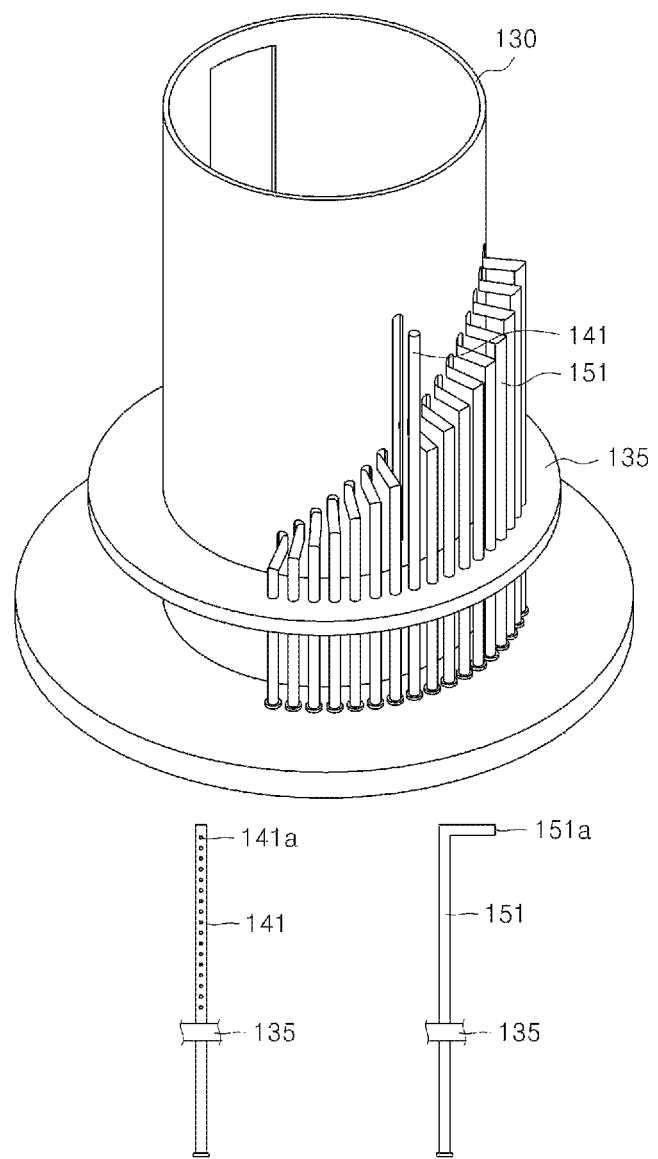
FIG. 4 is a perspective view illustrating structures of a tube and a gas supply part in accordance with an exemplary embodiment.
Figure 5:
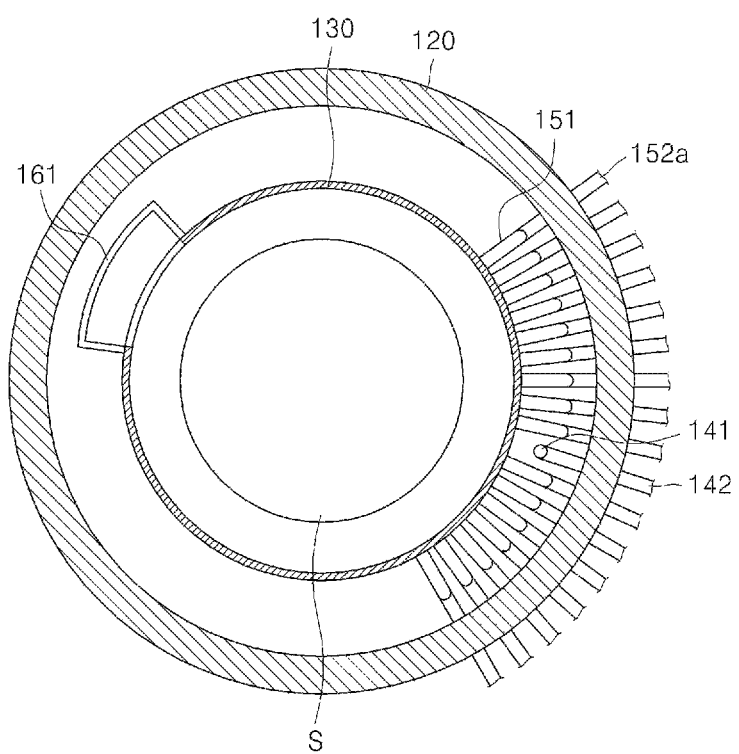
FIG. 5 is a plan view illustrating the structures of the tube and the gas supply part in accordance with an exemplary embodiment.
Figure 6:
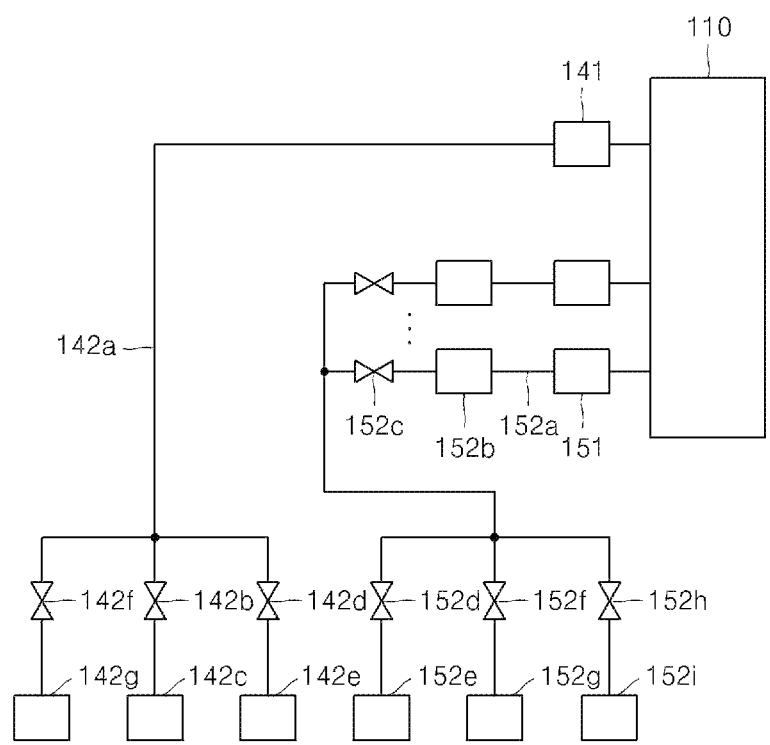
FIG. 6 is a view illustrating structures of a gas supply unit and a gas supply line in accordance with an exemplary embodiment.

FIG. 1 is a schematic view of substrate processing equipment in accordance with an exemplary embodiment, FIG. 2 is a view of a substrate processing apparatus in accordance with an exemplary embodiment, FIG. 3 is a view of a substrate support in accordance with an exemplary embodiment, FIG. 4 is a perspective view illustrating structures of a tube and a gas supply part in accordance with an exemplary embodiment, FIG. 5 is a plan view illustrating the structures of the tube and the gas supply part in accordance with an exemplary embodiment, and FIG. 6 is a view illustrating structures of a gas supply unit and a gas supply line in accordance with an exemplary embodiment.

A substrate processing apparatus 100 in accordance with an exemplary embodiment includes a substrate support 171 individually defining a plurality of spaces in which substrates S are respectively processed, a first gas supply part 140 for supplying a first gas into each of the processing spaces, a second gas supply part 150 disposed to correspond to the plurality of processing spaces to individually supply a second gas onto the plurality of substrates S, and an exhaust part 160 for exhausting a gas within a tube 130.

First, for helping the understanding of the description, substrate processing equipment in accordance with an exemplary embodiment will be described below.

Referring to FIG. 1, the substrate processing equipment includes process equipment 1000 and equipment front end modules (EFEMs) 50, 60, and 70. The EFEMs 50, 60, and 70 are mounted on a front side of the process equipment 1000 to transfer a substrate between a container (not shown) in which the plurality of substrates S are accommodated and the process equipment 1000. The container for sealing such as a front open unified pod (FOUP) may be used as the container.

The EFEM 50 is a frame, for example. The EFEM 60 include a plurality of loadports, for example. The frame is disposed between the loadports and the process equipment 1000. The container for accommodating the substrates S is placed on the loadports by a transfer unit (not shown) such as an overhead transfer, an overhead conveyor, or an automatic guided vehicle.

The EFEM 70 is a frame robot for transferring the substrates S between the container placed on the loadports and the process equipment 1000 is disposed within the frame, for example. Also, a door opener (not shown) for automatically opening/closing a door of the container may be disposed within the frame. Also, a fan filter unit (FFU) (not shown) for supplying cleaned air into the frame so that the cleaned air flows downward from an upper side within the frame may be disposed in the frame.

A predetermined process is performed on the substrates within the process equipment 1000. The process equipment 1000 includes a transfer device 200, a loadlock device 300, cleaning devices 500a and 500b, a buffer device 400, and epitaxial devices 100a, 100b, and 100c. Here, the substrate processing apparatus in accordance with an exemplary embodiment may be the epitaxial devices 100a, 100b, and 100c.

The transfer device 200 has a polygonal planar shape, and the loadlock device 300, the cleaning devices 500a and 500b, the buffer device 400, and the epitaxial devices 100a, 100b, and 100c are disposed on side surfaces of the transfer device 200.

The loadlock device 300 is disposed on a side surface of the transfer device 200, which is adjacent to the EFEMs 50, 60, and 70. The substrates S may temporally stay in the loadlock device 300 and then be loaded into the cleaning devices 500a and 500b, the buffer device 400, and the epitaxial devices 100a, 100b, and 100c by the transfer device 300. Then, the predetermined process is performed on the substrates S. After the process is completed, the substrates S may be unloaded by the transfer device 200 to temporally stay in the loadlock device 300.

The transfer device 200, the cleaning devices 500a and 500b, the buffer device 400, and the epitaxial devices 100a, 100b, and 100c are maintained in a vacuum state, and the loadlock device 300 is switched between a vacuum state and an atmosphere state. The loadlock device 300 may prevent external contaminants from being introduced into the transfer device 200, the cleaning devices 500a and 500b, the buffer device 400, and the epitaxial devices 100a, 100b, and 100c. Also, while the substrates S are transferred, the substrates S may not be exposed to the atmosphere to prevent an oxide layer from being grown on the substrates S.

Gate valves (not shown) are disposed between the loadlock device 300 and the transfer device 200 and between the loadlock device 300 and the EFEMs 50, 60, and 70, respectively. When the substrates S are transferred between the EFEMs 50, 60, and 70 and the loadlock device 300, the gate valve disposed between the loadlock device 300 and the transfer device 200 is closed. When the substrates S are transferred between the loadlock device 300 and the transfer device 200, the gate valve disposed between the loadlock device 300 and the EFEMs 50, 60, and 70 is closed.

The transfer device 200 includes a substrate handler 210. The substrate handler 210 transfers the substrates S between the loadlock device 300, the cleaning devices 500a and 500b, the buffer device 400, and the epitaxial devices 100a, 100b, and 100c. The transfer device 200 is sealed to be maintained in the vacuum state when the substrates S are transferred. Thus, the substrates S may be prevented from being exposed to the contaminants.

The cleaning devices 500a and 500b may clean the substrates S before an epitaxial process is performed on the substrates S within the epitaxial devices 100a, 100b, and 100c. To successfully perform the epitaxial process, an amount of oxide existing on the crystalline substrate has to be minimized. If a surface oxygen content of the substrate is too high, oxygen atoms may interrupt a crystallographic arrangement of a material that is deposited on the substrate. Thus, the epitaxial process may be harmfully affected. Thus, a cleaning process for removing native oxide (or surface oxide) formed on the substrates S may be performed within the cleaning devices 500a and 500b.

The epitaxial devices 100a, 100b, and 100c or the substrate processing apparatus in accordance with an exemplary embodiment may form an epitaxial layer on each of the substrates S. Here, the epitaxial devices 100a, 100b, and 100c may be selective epitaxial devices. In the current embodiment, three epitaxial devices 100a, 100b, and 100c are provided. Since the epitaxial process requires a relatively long time when compared to that of the cleaning process, manufacturing yield may be improved through the plurality of epitaxial devices 100a, 100b, and 100c. However, the exemplary embodiment is not limited to the number of epitaxial devices 100a, 100b, and 100c. That is, the epitaxial devices may be changed in number.

Hereinafter, the substrate processing apparatus (or the epitaxial device) 100 in accordance with an exemplary embodiment will be described in detail.

Referring to FIGS. 2 to 5, the substrate processing apparatus 100 in accordance with an exemplary embodiment includes a tube 130, a substrate support 171, a first gas supply part 140, a second gas supply part 150, and an exhaust part 160. Also, the substrate processing apparatus 100 may include a chamber 110 having an inner space, an external tube 120 disposed in the chamber 110 to define a space in which the tube 130 is accommodated therein, a heater 190 disposed around the external tube 120, a shaft 172 supporting the substrate support 171, a vertical driving part 173 vertically moving the substrate support 171, a rotational driving part 174 rotating the substrate support 171, and a support plate 180.

The chamber 110 has a rectangular or cylindrical shape to define an inner space therein. Also, the chamber 110 includes an upper chamber 110a and a lower chamber 110b. The upper chamber 110a and the lower chamber 110b communicate with each other. That is, the upper chamber 110a and the lower chamber 110b may form one box having a sealed inner space.

An insertion hole communicating with the transfer device 200 is defined in one side of the lower chamber 110b. Thus, a substrate S may be loaded from the transfer device 200 to the chamber 110 through the insertion hole. An introduction hole 220 is defined in one side of the transfer device 200 to correspond to the insertion hole of the chamber 110. A gate valve 230 is disposed between the introduction hole 220 and the insertion hole. Thus, the inner space of the transfer device 200 and the inner space of the chamber 110 may be isolated by the gate valve 230. Also, the introduction hole 220 and the insertion hole are opened or closed by the gate valve 230. Here, the insertion hole may be defined in the lower chamber 110b.

The external tube 120 is disposed above the lower chamber 110b having an opened upper portion or in the upper chamber 110a. The external tube 120 has an inner space in which the epitaxial process or the selective epitaxial process is performed and is opened downward. Also, a tube 130 may be accommodated in the external tube 120.

The heater 190 is provided in the chamber 110 and disposed to surround a side surface and upper portion of the external tube 120 or the tube 130. The heater 190 provides thermal energy to the external tube 120 or the tube 130 to heat the inner space of the external tube 120 or the tube 130. Thus, a temperature of the inner space of the external tube 120 or the tube 130 may be adjusted to a temperature at which the epitaxial process is capable of being performed.

The tube 130 is disposed above the lower chamber 110b or in the upper chamber 110a. In detail, the tube 130 is inserted into the inner space of the external tube 120 through the opened portion of the external tube 120 and then disposed in the inner space of the external tube 120. Also, the tube 130 defines a space in which the substrate support 171 is accommodated therein and is opened downward. Thus, when the substrate support 171 vertically moves within the upper chamber 110a and the lower chamber 110b, the substrate support 171 may be inserted into or withdrawn from the tube 130 through an opening of the tube 130.

The tube 130 may have a cylindrical shape and be opened downward. Also, through holes corresponding to an plurality of injection holes 141a of an injection unit 141 of the first gas supply part 140, which will be described later, and injection holes 151a of injectors 151 of the second gas supply part 150 are defined in one side of a circumference of the tube 130. In detail, the plurality of through holes 141a corresponding to the injection unit 141 may be defined in the tube 130 in a straight line shape along an extension direction of the injection unit 141. The through holes corresponding to the injectors 151 may be defined along cross-sections of ends of the injectors 151 so that the ends of the injectors 151 are insertable into the through holes. Also, a through hole communicating with the exhaust part 160 is defined in the other side of the circumference of the tube 130. However, an exemplary embodiment is not limited to the shape of the through hole. For example, the through hole may have various shapes.

Also, a lower portion of the tube 130 includes a protrusion that protrudes outward from the circumference of the tube 130 and is connected to the external tube 120 or the chamber 110 so that the tube 130 is connected to and supported by an inner wall of the external tube 120 or the chamber 110. Also, a support unit 135 having a disc shape and disposed on the circumference of the tube 130 to support the injection unit 141 and the injectors 151 may be disposed to stably support the injection unit 141 and the injectors 151. However, an exemplary embodiment is not limited to the structure and shape of the tube 130. For example, the tube 130 may have various structures and shapes.

The substrate support 171 stacks the plurality of substrates S in a vertical direction. For example, the substrate support 171 may stack 15 sheets of substrates in multistage. The substrate support 171 may individually define the processing spaces in which the plurality of substrates S are respectively processed. That is, the substrate support 171 may include a plurality of vertical layers, and one substrate S may be loaded on each of the layers. Thus, the processing spaces may be separately defined in the layers of the substrate support 171 to prevent the processing spaces from interfering with each other.

For example, referring to FIG. 3, the substrate support 171 may include a wafer boat 171a and 171b, a heat isolation unit (not shown), and a rotation kit (not shown). A protrusion protruding to a central portion to allow the substrate S to be seated is disposed on the wafer boat 171a and 171b. The protrusion may be vertically provided in plurality, and the substrate S is loaded on the protrusions. Also, a plurality of isolation plates for partitioning the processing spaces may be provided in the wafer boat 171a and 171b. For example, the isolation plates may have a disc shape and be provided in plurality to partition the processing spaces. Thus, the plurality of isolation plates may be vertically disposed between the substrates S in the stacking direction of the substrates, respectively. That is, the isolation plates a such as partitions may be provided between the protrusions on which the substrates S are respectively loaded. Thus, the plurality of processing spaces may be isolated from each other and be independently defined.

The heat isolation unit may be connected to a lower portion of the wafer boat 171a and 171b to prevent heat within the tube 130 from being lost. The rotation kit may have an upper portion connected to a lower portion of the heat isolation unit and a lower portion connected to the shaft 172.

The shaft 172 vertically extends and has an upper end connected to a lower portion of the substrate support 171. The shaft 172 supports the substrate support 171. A lower portion of the shaft 172 passes through the lower chamber 110b and is connected to the vertical driving part 173 and the rotational driving part 174 outside the lower chamber 110b.

The vertical driving part 173 is connected to the shaft 172 to vertically move the shaft 172. Thus, the substrate support 171 connected to the upper end of the shaft 172 may vertically move along the shaft 172. For example, the substrate support 171 may move downward by the operation of the vertical driving part 173 and then be disposed in the lower chamber 119b (or at a loading position). Thus, the substrate S loaded from the transfer device 200 to the lower chamber 110b may be loaded on the substrate support 171 that is disposed in the lower chamber 110b.

When all the plurality of substrates S are loaded on the substrate support 171, the substrate support 171 may move upward by the vertical driving part 173 to move in the external tube 120 or the tube 130 (or at a process position). Thus, the epitaxial process may be performed on the substrates S within the external tube 120 or the tube 130.

The rotational driving part 174 is connected to the shaft 172 connected to the substrate support 171 to rotate the substrate support 171. The rotational driving part 174 rotates the shaft 172 with respect to a vertical central axis of the shaft 172. Thus, the substrate support 171 connected to the shaft 172 may also rotate with respect to the vertical central axis. When the processing process is performed on the substrate S, at least one kind of gas supplied to one side of the tube 130 may pass through the substrates S stacked on the substrate support 171 and then be discharged to the other side of the tube 130. Here, when the substrate support 171 rotates by the operation of the rotational driving part 174, the gases that will pass through the substrate support 171 may be mixed and thus uniformly distributed on an entire surface of the substrate S. Thus, a thin film deposited on the substrate S may be improved in quality.

The support plate 180 is installed on the shaft 172 and elevated together with the substrate support 171 to seal the process space within the external tube or the tube 130 from the outside. The support plate 180 is disposed to be spaced apart from a lower portion of the substrate support 171. Also, a sealing member 181 having an O-ring shape may be provided between the support plate 180 and the external tube 120 or between the support plate 180 and the tube 130 to seal the process space. A bearing member 182 may be provided between the support plate 180 and the shaft 172, and the shaft 172 may rotate in a state in which the shaft is supported by the bearing member 182.

Referring to FIGS. 4 to 6, the first gas supply part 140 includes an injection unit 141 extending in the stacking direction of the substrates S and a gas supply unit 142 connected to the injection unit 141 to supply a gas into the injection unit 141. Here, the first gas supply part 140 may supply a silicon source gas and an etching gas onto the plurality of substrates S. That is, the first gas supply part 140 supplies a main source gas for the processing process of the substrates S into the processing space.

The injection unit 141 has a pipe shape to extend in a direction in which the substrates S are stacked, for example, a vertical direction. The injection unit 141 is disposed between the tube 130 and the external tube 120. The injection unit 141 has a closed upper portion and a lower portion connected to the gas supply unit 142. Also, a plurality of injection holes 141a defined corresponding to the processing spaces of the substrates S are defined in the injection unit 141 along the stacking direction of the substrates S. That is, an injection hole 141a may be defined in a portion corresponding to each of the layers of the substrate support 171. Thus, a first gas supplied into the injection unit 141 through the gas supply unit 142 may be supplied into each of the processing spaces of the substrates S through the injection hole 141a.

The plurality of injection holes 141a may have diameters that gradually increase in a direction that is away from a portion of the injection unit 141, which is connected to the gas supply unit 142. For example, when the gas supply unit 142 is connected to a lower end of the injection unit 141 to supply the first gas from the lower portion to the upper portion of the injection unit 141, the upper injection hole may have a diameter greater than that of the lower injection hole.

That is, in case of the injection hole that is adjacent to the gas supply unit 142, since the first gas is supplied to the adjacent position, a large amount of first gas may be easily introduced. On the other hand, in case of the injection hole defined at a long distance from the first gas supply part 140, since the first gas is supplied over a long distance, only the first gas remaining after being introduced into the injection hole may be supplied into the injection hole. Thus, when the first gas is supplied into the injection unit 141 through the first gas supply part 140, an amount of first gas injected through the injection hole that is adjacent to the first gas supply part 140 and an amount of first gas injected through the injection hole that is far away from the first gas supply part 140 may be different from each other.

Thus, the injection hole that is adjacent to the first gas supply part 140 may decrease in diameter to reduce an amount of first gas to be injected, and the injection hole that is far away from the first gas supply part 140 may increase in diameter to increase an amount of first gas to be injected. That is, the injection holes 141a may be adjusted in diameter so that a uniform amount of first gas is supplied through the injection hole that is adjacent to the first gas supply part 140 and the injection hole that is far away from the first gas supply part 140. Thus, the first gas may be uniformly supplied to the substrates S on the layers to improve the process efficiency.

The gas supply unit 142 includes a first gas tube 142a defining a path through which the first gas moves, at least one gas supply source that stores at least one kind of gas, and at least one valve provided for the gas supply source.

Here, the first gas may include a silicon source gas, an etching gas, and a carrier gas. Also, silane (SiH4) and dichlorosilane (DCS) may be uses as the silicon source gas, hydrochloric acid (HCl) may be uses as the etching gas, and hydrogen (H2) may be used as the carrier gas. The carrier gas may dilute a concentration of the silicon gas or the etching gas. Thus, when an amount of carrier gas to be supplied is controlled, the concentration of the silicon source gas or the etching gas may be controlled. Since the silicon gas, the etching gas, and the carrier gas have molecular weights different from each other, the silicon gas, the etching gas, and the carrier gas may be easily mixed with each other. However, the first gas is not limited to the above-described materials. For example, the first gas may include various materials such as a dopant gas.

The first gas tube 142a has a pipe shape. Also, the first gas tube 142a has one end connected to the injection unit 141 and the other end connected to the gas supply source.

The first gas supply source may be provided in number to correspond to kinds of gases that are provided as the first gas. For example, the gas supply source may include a silicon source gas supply source 142c, an etching gas supply source 142e in which the etching gas is stored, and a carrier gas supply source 142g in which the carrier gas is stored. Here, the first gas tube 142a has the other end of which a path is branched and then connected to the gas supply sources. That is, a moving path of the silicon source gas, a moving path of the etching gas, and a moving path of the carrier gas may be combined with each other and then connected to the injection unit 141.

Control valves 142b, 142d, and 142f may be respectively provided in the gas supply sources to control a flow rate of the gas supplied into the first gas tube 142a. For example, the control valves 142b, 142d, and 142f may include a silicon source gas control valve 142b provided in the silicon source gas supply source 142c to control a flow rate of the silicon source gas, an etching gas control valve 142d provided in the etching gas supply source 142e to control a flow rate of the etching gas, and a carrier gas control valve 142f provided in the carrier gas supply source 142g to control a flow rate of the carrier gas. Thus, when the control valves 142b, 142d, and 142f are controlled, the total flow rate of the first gas injected onto the substrate S through the injection unit 141 may be controlled. Also, a kind of gas to be supplied onto the substrate S may be selected by using the control valves 142b, 142d, and 142f. However, an exemplary embodiment is not limited to the above-described kind of gas to be used or the above-described structure of the first gas supply part 140. For example, the kind of gas and the structure of the first gas supply part 140 may vary.

The second gas supply part 150 includes a plurality of injectors 151 that are disposed at heights different from each other to respectively correspond to the processing spaces and a plurality of gas supply lines 152 respectively connected to ends of the injectors 151. Here, the second gas supply part 150 may selectively supply the dopant gas or the etching gas onto each of the plurality of substrates S. That is, the second gas supply part 150 may supply an auxiliary gas into the processing spaces in the substrate processing process.

Each of the injectors 151 may have a pipe shape, and the injectors 151 may be provided in number corresponding to the number of processing spaces of the substrate support 171 or provided in number that is less by one than the number of processing spaces. For example, when the substrate support 171 may support 15 sheets of substrates S to form 15 substrate processing spaces, 14 injectors 151 may be provided. That is, the injectors 151 may be connected to all the processing spaces except for one portion overlapping the injection unit 141.

An injection hole 151a through which a gas is injected may be defined in the other end of each of the injectors 151, and the other end of the injector 151 may extend to the processing space. Also, the injector 151 is disposed between the tube 130 and the external tube 120. For example, the injector 151 may have a "⏋" shape. Thus, the end of the injector 151, which protrudes to the processing space of the substrate S may contact the process space through the through hole of the tube 130. Thus, a second gas supplied to one end, e.g., a lower end of the injector 151 through the gas supply line 152 may be supplied into the injector 151 and then injected onto the substrate S disposed in each of the processing spaces through the injection hole 151a.

Also, the plurality of injectors 151 may have heights different from each other to supply the gas into each of processing spaces, i.e., each of the layers of the substrate support 171. That is, the injector 151 contacting the lower processing space may have a low height, and the injector 151 contacting the upper processing space may have a high height. For example, the injection holes 151a of the injectors 151 may be spirally defined along the circumference of the tube 130. Also, the injector 151 having the highest height may be disposed at the highest position, and then, other injectors may be successively disposed according to their heights. Thus, when the plurality of injectors 151 having the heights different from each other are regularly disposed, spatial efficiency may be improved when compared to a case in which the plurality of injectors 151 are irregularly disposed.

The gas supply line 152 includes a second gas tube 152a defining a path through which the gas moves and connected to each of the injectors, a flow sensor 152b installed in the second gas tube 152a to measure a flow rate of the gas within the second gas tube 152a, and a valve installed in the second gas tube 152a to control the flow rate within the second gas tube 152a.

Here, the second gas may include at least one of the dopant gas, the etching gas, and the carrier gas. Here, hydrochloric acid (HCl) may be uses as the etching gas, and hydrogen (H2) may be used as the carrier gas. The dopant gas may be mixed with the silicon source gas to deposit a thin film on the substrate S. Thus, when a concentration of the dopant gas within the processing space in which the substrate S is processed is controlled, a doping concentration of the silicon thin film may be individually controlled. The carrier gas may dilute a concentration of the silicon gas or the etching gas. Thus, when an amount of carrier gas to be supplied is controlled, the concentration of the silicon source gas or the etching gas may be controlled. However, the second gas is not limited to the above-described materials. For example, the second gas may include various materials such as the silicon source gas.

Thus, kinds of second gas may be selectively used to select a process for each processing space. That is, when only the etching gas is selected as the second gas, a mixing ratio of the etching gas within the processing space may increase to perform the etching process so that selective epitaxial growth is realized on the substrate S. Also, when only the dopant gas is selected as the second gas, a mixing ratio of the dopant gas within the processing space may increase, and thus, the silicon source gas of the first gas and the dopant gas may be mixed with each other to form a thin film on the substrate S. Also, when the supply of the second gas is stopped, a silicon thin film may be formed on the substrate S within the processing space by using the first gas.

When the second gas tube 152*a* is connected to the silicon source gas supply source, a thickness of the thin film formed on the substrate S may be more effectively controlled. That is, when the thin film formed on the substrate S has a thin thickness, the silicon source gas as the second gas may be supplied. When the thin film formed on the substrate S has a thick thickness, the etching gas as the second gas may be supplied to adjust the thickness of the thin film formed on the substrate S. Thus, the second gas supplied for each processing space of the substrate S may be selected to control a thickness of the substrate S in each of the processing spaces, thereby improving quality of the thin film formed on the substrate S.

The second gas tube 152*a* has a pipe shape. Also, the second gas tube 152*a* may have one end connected to the injector 151 and the other end connected to supply sources 152*e*, 152*g*, and 152*i*.

The supply sources 152*e*, 152*g*, and 152*i* may be provided in number to correspond to kinds of gases that are provided as the second gas. For example, the supply sources 152*e*, 152*g*, and 152*i* may include a dopant gas supply source 152*e* in which the dopant gas is stored, an etching gas supply source 152*g* in which the etching gas is stored, and a carrier gas supply source 152*i* in which the carrier gas is stored. One end of the second gas tube 152*a* may be divided and then respectively connected to the plurality of injectors 151. Then, the divided ends of the second gas tube 152*a* may be combined with each other and then divided by number corresponding to the supply sources 152*e*, 152*g*, and 152*i*. Thus, the other ends of the second gas tube 152*a* may be connected to the supply sources 152*e*, 152*g*, and 152*i*, respectively.

Flow control valves 152*d*, 152*f*, and 152*h* may be respectively provided in the supply sources 152*e*, 152*g*, and 152*i* to control a flow rate of the gas supplied into the second gas tube 152*a*. For example, the flow control valves 152*d*, 152*f*, and 152*h* may include a dopant gas flow control valve 152*d* provided in the dopant gas supply source 152*e* to control a flow rate of the dopant gas, an etching gas flow control valve 152*f* provided in the etching gas supply source 152*g* to control a flow rate of the etching gas, and a carrier gas flow control valve 152*h* provided in the carrier gas supply source 152*i* to control a flow rate of the carrier gas. Thus, when the flow control valves 152*d*, 152*f*, and 152*h* are controlled, the total flow rate of the second gas injected onto the substrate S through the injectors 151 may be controlled, and a kind of gas to be injected may be selected.

The flow sensor 152*b* may be provided in each of the divided ends of the second gas tube 152*a*. That is, to individually measure an amount of second gas supplied into each of the processing spaces, the flow sensor 152*b* may be provided in number corresponding to the number of processing spaces. Here, the flow sensors 152 may be individually provided on a plurality of ends of the second gas tube 152*a*, which are connected to the processing spaces. The flow sensor 152*b* may be disposed between portions at which the injection unit 141 and the ends of the second gas tube 152*a* are combined with each other. Thus, a flow rate of the second gas supplied into each of the processing space may be monitored in real time by using the flow sensor 152*b*.

The valve 152*c* is disposed in each of the divided ends of the second gas tube 152*a*. That is, to individually control an amount of second gas supplied into each of the processing spaces, the flow sensor 152*b* may be provided in number corresponding to the number of processing spaces. Here, the flow sensors 152*b* may be individually provided on a plurality of ends of the second gas tube 152*a*, which are connected to the processing spaces. The valve 152*c* may be disposed between portions at which the injection unit 141 and the ends of the second gas tube 152*a* are combined with each other. Also, the valve 152*c* may be disposed at a front end or rear end of the flow sensor 152*b*. Thus, when the operation of the valve 152*c* is controlled, a flow rate of second gas supplied into each of the processing spaces may be individually controlled.

In terms of this operation, a difference in thickness of the thin films formed on the substrates S may occur in the processing spaces of the substrate S, which are defined in the substrate support 171. If the thin film formed on the substrate S has a very thick thickness, an amount of dopant gas supplied into the process space has to decrease, or an amount of supplied etching gas has to increase. On the other hand, if the thin film formed on the substrate S has a very thin thickness, an amount of supplied dopant gas has to increase, and an amount of supplied etching gas has to decrease. Thus, if the thin films formed on the substrates S have thicknesses different from each other, when an amount of second gas supplied onto a predetermined substrate is controlled, the thin film formed on one substrate may have a very thick thickness, and the thin film formed on the other substrate may have a very thin thickness.

Thus, the thickness of the thin film formed on each of the processing spaces may be confirmed to control a concentration of the supplied gas according to the processing spaces. That is, while a flow rate of gas supplied into each of the processing spaces is measured by using the flow sensor 152*b*, a flow rate of gas supplied into each of the processing space may be controlled through the valve 152*c* according to the thicknesses of the thin films formed on the substrates S. Thus, the concentration of gas may be independently controlled for each processing space without determining the concentration of the gas supplied with respect to the predetermined substrate S.

For example, if the thin film formed on the uppermost substrate S has a very thick thickness, an amount of supplied etching gas increases to the uppermost processing space to etch a portion of the thin film, and the supply of etching gas into the lowermost processing space may be interrupted.

For example, a selective epitaxial growth (SEG) process on the substrate S may be performed as follows. Temperatures of all the processing spaces in which the substrates S are accommodated may increase to a temperature that is adequate for the SEG by using the heater 190. Then, the first gas including at least one of the silicon source gas, the etching gas, and the carrier gas may be supplied into all the processing spaces through the first gas supply part 140. The first gas passes through the substrates S and then is discharged to the outside of the processing spaces through the exhaust part 160. Then, the second gas may be supplied into each of the processing spaces through various methods, which will be described below, by using the second gas supply part 150.

First, all the flow control valves 152*d*, 152*f*, and 152*h* and all the valves of the second gas tube 152*a* may be opened to supply the second gas including at least one of the dopant gas, the etching gas, and the carrier gas into all the processing spaces. Thus, the first gas and the second gas may be mixed with each other to form a thin film that is formed of a mixture of silicon and dopant on the substrate S.

Second, after the dopant gas flow control valve 152*d* is closed, all the valves 152*c* of the second gas tube 152*a* may be opened to supply only the etching gas into each of the processing spaces and remove impurities within the processing spaces. Also, the etching gas may etch the thin film to reduce a thickness of the thin film. That is, in the state in which the first gas including at least one of the silicon source gas, the etching gas, and the carrier gas is supplied into the processing spaces, the second gas including only the etching gas may be supplied into the processing spaces. Thus, a ratio of the etching gas in the gases within the processing spaces may increase to etch the thin film.

Here, an amount of etching gas supplied into the processing space in which the substrate S on which the thin film having a thin thickness is formed is accommodated may be adjusted. That is, only the valve 152*c* of the second gas tube 152*a* connected to the processing space in which the substrate S having the thin thickness is accommodated may be closed to reduce only a flow rate of the etching gas supplied into the processing spaces or interrupt the introduction of the etching gas. Thus, the amount of etching gas to be supplied for each processing space may be controlled so that a large amount of etching gas is supplied into the processing space in which the substrate S on which the thin film having the thick thickness is formed is accommodated, and a small amount of etching gas is supplied into the processing space in which the substrate S including the thin film having the thin thickness is accommodated, or the supply of the etching gas into the processing space in which the substrate S including the thin film having the thin thickness is accommodated is stopped.

The selective epitaxial process may be performed on the substrate S including an oxide or nitride layer that is patterned in the former process. First, the first gas including the silicon source gas may be supplied onto the substrate S. Thus, the silicon source may be deposited on the substrate S. Here, a difference in thin film formation rate between a silicon bare portion of the substrate S and a patterned portion of the substrate S may occur.

Thus, the second gas may be supplied onto the substrate S to adjust components of the gas within the processing space in which the substrate S is processed. That is, when the second gas including only the etching gas or only the etching gas and the carrier gas is supplied into the processing space, the first gas and the second gas may be mixed with each other to increase a ratio of the etching gas within the processing space by the second gas. Thus, the thin film disposed on the portion of the substrate S at which the formation of the thin film is slow may be removed by the etching gas before the thin film is grown. On the other hand, the thin film disposed on the portion of the substrate S at which the formation of the thin film is fast may be deposited and grown before being removed by the etching gas. Thus, when the concentration of the etching gas of the second gas is controlled, the selective epitaxial process may be performed.

Also, the amount of second gas supplied into each of the processing spaces may be individually controlled by the valve 152*c* provided in each of the processing spaces of the second gas supply part 150. Thus, when the concentration of the etching gas for each processing space is controlled, the deposition of the thin film may actively occur on a portion of the substrate S and may slowly occur on the other portion of the substrate S to selectively control processing environments of the substrate S according to the growth rate of the thin film on the substrate S.

Third, after the dopant gas flow control valve 152*d* is opened, and the etching gas flow control valve 152*f* is closed, all the valves 152*c* of the second gas tube 152*a* may be opened to supply only the etching gas into each of the processing spaces. The dopant gas supplied into the processing spaces may be mixed with the first gas to form a thin film on the substrate S. Here, an amount of dopant gas supplied into the processing space in which the doped concentration of the silicon thin film in the thin film is high may be adjusted.

That is, the second gas tube 152*a* connected to the processing space in which the doped concentration of the thin film is high may be closed to reduce only the flow rate of the dopant gas supplied into the processing space or block the introduction of the dopant gas. Thus, the amount of dopant gas to be supplied for each processing space may be controlled to supply a small amount of dopant gas into the processing space in which the doped concentration of the thin film is high or stop the supply of the dopant gas and to supply a large amount of dopant gas into the processing space in which the doped concentration of the thin film is low.

Fourth, all of the dopant gas flow control valve 152*d* and the etching gas flow control valve 152*f* may be closed, and all valves 152*c* of the second gas tube 152*a* may be closed. Thus, since only the first gas is supplied into the processing spaces, only the silicon thin film may be formed on the substrate S by the silicon source gas.

The thin film having high quality, i.e., the selective epitaxial layer having high quality may be formed through the above-described various combinations. Also, the optimum condition under which the substrate S is independently processed in each of the processing spaces may be created to improve the quality of the produced substrate S or the thin film on the substrate S. However, an exemplary embodiment is not limited to the supply order and method of the dopant gas and the etching gas. For example, the dopant gas and the etching gas may be supplied through various orders and methods.

Since the first gas supply part 140 for supplying the first gas and the second gas supply part 150 for supplying the second gas are separately provided, the mixing ratio of the gases supplied into the plurality of processing spaces may be controlled. That is, the first gas supply part 140 may supply the main gas (the first gas) for the substrate processing process into all the processing spaces to deposit the silicon thin film on the substrate S. The second gas supply part 150 may supply the auxiliary gas (the second gas) for the substrate processing process to mix the auxiliary gas with the main gas. Here, the second gas supply part 150 may select at least one of the dopant gas and the etching gas to supply the selected gas into each of the processing spaces. Thus, the concentration of the dopant gas or the etching gas within the processing spaces may increase. Thus, the gas supplied through the second gas supply part 150 may adjust a ratio of the components of the gases supplied from the first gas supply part 140. That is, the first gas or the gas within the processing spaces may be tuned through the supply of the second gas.

For example, when the etching gas as the second gas is supplied, a ratio of the etching gas to be supplied into the processing spaces may increase to perform the etching process so that the selective epitaxial growth is realized. On the other hand, when the dopant gas as the second gas is supplied, a ratio of the dopant gas in the processing spaces may increase to actively perform the doping process in the processing spaces. Thus, when a kind of gas to be supplied from the second gas supply part 150 is selected, the doping process, the etching process, or the selective epitaxial process to be performed in the processing spaces may be selected.

Also, the second gas supply part 150 may individually control the flow rate of the second gas to be supplied into each of the plurality of processing chambers. Thus, the component of the gas within each of the processing spaces may be individually adjusted through the second gas supply part 150. Thus, the environment within each of the processing spaces may be easily controlled to simplify the structure of the equipment.

On the other hand, when the first gas supply part 140 and the second gas supply part 150 are not separately provided, and the processing gas is supplied into the plurality of processing spaces through one gas supply part, it may be difficult to individually control the component of the gas within the plurality of processing spaces. That is, only the gas component with respect to the whole processing spaces may be controlled, but the component of the gas within each of the processing spaces may not be controlled. Thus, when the processing gas is supplied into a specific processing space, the thin film may not be properly deposited on the substrate or may be excessively deposited within other processing spaces.

In addition, when the silicon source gas supply source, the dopant gas supply source, the etching gas supply source, and the carrier gas supply source are connected to the plurality of processing spaces, respectively, it may be difficult to tune the gas within the processing spaces. That is, although the gas to be supplied into each of the processing spaces is selected, the constituent for controlling the flow rate of the gas may not be provided to limit the tuning. On the other hand, the second gas supply part 150 in accordance with an exemplary embodiment may include the separate valve 152*c* and the flow sensor 152*b*, which control the flow rate of the second gas to be supplied into each of the processing spaces to easily control the kind and flow rate of the gas to be supplied into the processing spaces.

Also, when the silicon source gas supply source, the dopant gas supply source, the etching gas supply source, and the carrier gas supply source are connected to the plurality of processing spaces, respectively, the number of gas supply sources may increase as the number of processing spaces increases, and the connection structure of the gas tubes may be complicated to increase a volume of the equipment. As the equipment is complicated in structure, the equipment may be difficult in maintenance.

The exhaust part 160 includes an exhaust tube 161 having an exhaust hole communicating with the inner space of the tube 130 and installed on the other side of the tube 130, an exhaust line 162 having one end connected to the exhaust tube 161, and an exhaust pump (not shown) connected to the other end of the exhaust line 162. The exhaust hole of the exhaust tube 161 may be defined to correspond to the injection hole of the injection unit 141 that is disposed in the one side of the circumference of the tube 130. Also, an exhaust gas control valve (not shown) may be provided in the exhaust line 162 to open and close the exhaust line 162. Thus, the exhaust part 160 may discharge gases or reaction byproducts within the tube 130 to the outside of the tube 130. However, an exemplary embodiment is not limited to the structure and shape of the substrate processing apparatus 100. For example, the substrate processing apparatus 100 may have various structures and shapes.

As described above, the gas supply parts 140 and 150 for individually supplying the gas into each of the processing spaces in which the plurality of substrates S are processed may be provided to separately control the amount of gas to be supplied into the processing spaces according to the situation of each of the substrates S. Thus, since the processing process is performed under the optimal condition of the substrate S, the substrate S or the thin film on the substrate S may be improved in quality.

Also, since the gas supply parts 140 and 150 selectively supply at least one kind of gas into the processing spaces according to the situation of the processing process, the thin film formed on the substrate S may be adjusted in thickness, thereby improving the quality of the substrate S or the thin film on the substrate S.

Also, since the amount and kind of gas supplied to each of the processing spaces are controlled, the conditions of the processing process may be quickly controlled according to the situation of the substrate S. Thus, the defects of the substrate S or the thin film on the substrate S may be reduced to improve the efficiency of the substrate processing process.

Also, the first gas supply part 140 for supplying the main gas and the second gas supply part 150 for selectively supplying at least one of at least one kind of gas may be provided to select the gas to be supplied from the second gas supply part, thereby controlling the mixing ratio of the gases within the processing spaces. Also, the gas to be supplied from the second gas supply part 150 may be selected to selectively perform the various processing processes on the substrate S.

As described above, while this invention has been particularly shown and described with reference to preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:
1. A substrate processing apparatus comprising:
a tube having a cylindrical shape and defining an inner space;
a substrate support on which a plurality of substrates are stacked in multistage within the tube, the substrate support individually defining a plurality of processing spaces in which the plurality of substrates are respectively processed;

a first gas supply part configured to supply a first gas into all the plurality of processing spaces;

a second gas supply part configured to individually supply the second gas onto each of the plurality of substrates to adjust a component of a gas within each of the processing spaces; and an exhaust part configured to exhaust gases within the tube, wherein the second gas supply part comprises:
- a plurality of injectors provided in number corresponding to the number of processing spaces, and disposed to respectively correspond to the plurality of processing spaces to supply the second gas into each of the plurality of processing spaces, and
- a plurality of gas supply lines, wherein each gas supply line of the plurality of gas supply lines is connected to a respective injector of the plurality of injectors, wherein a first through hole and plurality of second through holes are formed within the tube and are circumferentially offset relative to one another within the tube, wherein the first through hole is formed in the tube in a straight line shape along an extension direction of the first gas supply part, and corresponds to a plurality of injection holes provided in the first gas supply part, wherein the second through holes of the plurality of second through holes are axially offset relative to one another within the tube so as to be arranged at different heights from one another, wherein each injector of the plurality of injectors includes a first portion and a second portion, wherein the second portion is bent relative to the first portion, and wherein the second portion of each injector of the plurality of injectors is inserted into a corresponding second through hole of the plurality of second through holes, and wherein the first portion of the plurality of injectors have heights different from each other to respectively correspond to heights of the processing spaces and to heights of the second through holes, wherein each of the plurality of gas supply lines further comprises:
- a gas tube configured to define a path through which the second gas moves,
- a flow sensor installed in the gas tube to measure a flow rate of the gas within the gas tube; and
- a plurality of valves installed in the gas tube to individually control an amount of the second gas supplied into each of the processing spaces, wherein the plurality of gas supply lines individually control and measure the flow rate of the second gas supplied to each of the processing spaces for individually tuning the gas within each of the processing spaces.

2. The substrate processing apparatus of claim 1, wherein the first gas supply part comprises:
- an injection unit extending in a direction in which the substrates are stacked; and
- a gas supply unit connected to the injection unit to supply the first gas into the injection unit, wherein the plurality of injection holes are defined in the injection unit to correspond to the processing spaces in the direction in which the substrates are stacked.

3. The substrate processing apparatus of claim 2, wherein the plurality of injection holes have diameters that gradually increase in a direction that is away from the portion at which the injection unit and the gas supply unit are connected to each other.

4. The substrate processing apparatus of claim 1, wherein a plurality of injection holes through which the second gas is injected are defined in the other ends of the injectors, and
the plurality of injection holes are spirally defined along a circumference of the tube.

5. The substrate processing apparatus of claim 1, further comprising a rotational driving part connected to the substrate support to rotate the substrate support.

6. The substrate processing apparatus of claim 1, further comprising an external tube configured to accommodate the tube therein,
wherein an injection unit of the first gas supply part and the plurality of injectors of the second gas supply part are disposed between the tube and the external tube.

7. The substrate processing apparatus of claim 1, wherein the first gas supply part supplies the first gas comprising a silicon source gas.

8. The substrate processing apparatus of claim 1, wherein the second gas supply part selectively supplies the second gas comprising at least one of a dopant gas and an etching gas onto each of the plurality of substrates.

9. The substrate processing apparatus of claim 1, wherein the substrate support comprises a plurality of isolation plates that are respectively disposed between the substrates in a stacking direction of the substrates to isolate the plurality of processing spaces from each other.

\* \* \* \* \*